United States Patent
Wang (10) Patent No.: US 7,609,110 B2
(45) Date of Patent: Oct. 27, 2009

(54) FILTERLESS CLASS-D SPEAKER DRIVER WITH LESS SWITCHING

(75) Inventor: Minsheng Wang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 176 days.

(21) Appl. No.: 11/797,037

(22) Filed: Apr. 30, 2007

(65) Prior Publication Data

US 2008/0265989 A1 Oct. 30, 2008

(51) Int. Cl.
H03F 3/38 (2006.01)
(52) U.S. Cl. .................. 330/10; 330/251; 330/207 A; 330/146
(58) Field of Classification Search .............. 330/10, 330/251, 207 A, 146; 375/238
See application file for complete search history.

(56) References Cited

U.S. PATENT DOCUMENTS 7,388,426 B2 * 6/2008 Chang et al. ............ 330/10

OTHER PUBLICATIONS

S.R. Norsworthy, R. Schier, G.C. Temes, "Delta-Sigma Data Converters: Theory, Design, and Simulations", Chapter 5, IEEE Press, New York, 1997.
"1.4-W Mono Filterless Class-D Audio Power Amplifier", Texas Instruments TPA2005D1 Data Sheet, Nov. 2004.
"500mW, Low EMI, Filterless, Class-D Audio Amplifier", Maxim MAX9712 Data Sheet, Jan. 2004.
"1.3W, Filterless, Stereo Class-D Audio Power Amplifier", Maxim MAX9701 Data Sheet, Sep. 2005.

* cited by examiner

Primary Examiner—Michael B Shingleton
(74) Attorney, Agent, or Firm—Sterne, Kessler, Goldstein & Fox P.L.L.C.

(57) ABSTRACT

Methods for designing a filterless class-D amplifier and driver are described herein. In the exemplary embodiment, a feedback loop is used to stabilize the filterless class-D amplifier. A pulse width modulated (PWM) output signal is generated by adding a comparator input signal to a comparative signal, and comparing the sum to a peak voltage, which can be a peak value of the comparative signal. A limit of one PWM sample will be generated half per period of the comparative signal, resulting in lower dynamic switching noise and a decreased sensitivity to jitter noise than conventional filterless class-D amplifiers.

23 Claims, 6 Drawing Sheets

FILTERLESS CLASS-D SPEAKER DRIVER WITH LESS SWITCHING

BACKGROUND OF THE INVENTION

1. Field of the Invention

The present invention relates to methods of filtering. Specifically, the present invention relates to methods of filtering signals with a class-D amplifier.

2. Background Art

Conventional class-D amplifiers, or switching amplifiers, are important for applications that require high efficiency, broad bandwidth, and low signal distortion. Linear amplifiers such as class-A and class-AB amplifiers yield low signal distortion and broadband response, but are limited in maximum theoretical efficiency to 25% and 78.6%, respectively. In practice, class-AB amplifiers operate closer to 30% efficiency when driven with voice or music.

Pulsed linear amplifiers, such as a class-C amplifier, can yield efficiencies as high as 90%. But class-C amplifiers distort the signal in all but narrow band applications. Class-C amplifiers work well in conjunction with tuned circuits, as in radio frequency amplifies.

None of the aforementioned amplifiers is as efficient as a class-D amplifier, with practical efficiencies of 95% or higher. Further, class-D amplifiers replicate the input signal over a broad band, a limiting factor for class-C amplifiers.

One of the drawbacks to conventional class-D amplifiers is that a 50% duty cycle square wave is driven to the output when no input signal is present. With no filter, the square wave appears across the load as a DC voltage, resulting in a finite load current, increasing power consumption. In many cases, providing the filter to remove the DC component is prohibited by space and packaging limitations.

Filterless class-D amplifiers address DC power consumption concerns by providing differential pulse width modulation (PWM) of the input signal. As a result, the output signal is driven to zero when no input signal is present, substantially reducing power consumption. Filterless class-D amplifiers accomplish this by providing two pulses per period of the comparative signal. Pulses are generated in accordance with a state machine, triggered by clock and reference signal inputs.

In contrast to conventional class-D amplifiers, filterless class-D amplifiers produce very narrow pulses, nearly eliminating DC power consumption. However, filterless class-D amplifiers generate high frequency dynamic switching noise, a direct result of driving narrow pulses at the output. Some, but not all of the high frequency dynamic switching noise above 20 kHz is rejected by voice coils due to their inductance, standard in most speakers. What is needed is a filterless class-D amplifier that eliminates DC power consumption and significantly reduces high frequency noise at the output.

BRIEF SUMMARY OF THE INVENTION

The present invention fulfills needs present in the art by providing methods for designing a filterless class-D amplifier that eliminates DC power consumption and significantly reduces high frequency noise at the output. To accomplish both of these objectives simultaneously, the present invention operates similarly to a differential PWM filterless class-D amplifiers, but limits the output driver to one pulse per cycle of the comparative signal, rather than two pulses per cycle, as is standard with conventional filterless class-D amplifiers.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers indicate identical or functionally similar elements.

DETAILED DESCRIPTION OF THE INVENTION

It should be appreciated that the particular implementations shown and described herein are examples of the present invention and are not intended to otherwise limit the scope of the present invention in any way. Further, the techniques are suitable for applications in electrical systems, optical systems, consumer electronics, industrial or military electronics, wireless systems, space applications, or any other application.

The present invention is a filterless class-D amplifier that functions with one differential output signal, or pad, active for each half cycle of a comparative signal, where a half cycle is defined to span consecutive zero crossings of the comparative signal. The comparative signal is typically periodic, but is not necessarily limited to periodic signal sets. In a representative embodiment, a second-order feedback loop is used to low-pass filter an amplifier input signal and allow an amplifier output signal to track the amplifier input signal.

Figure 1:
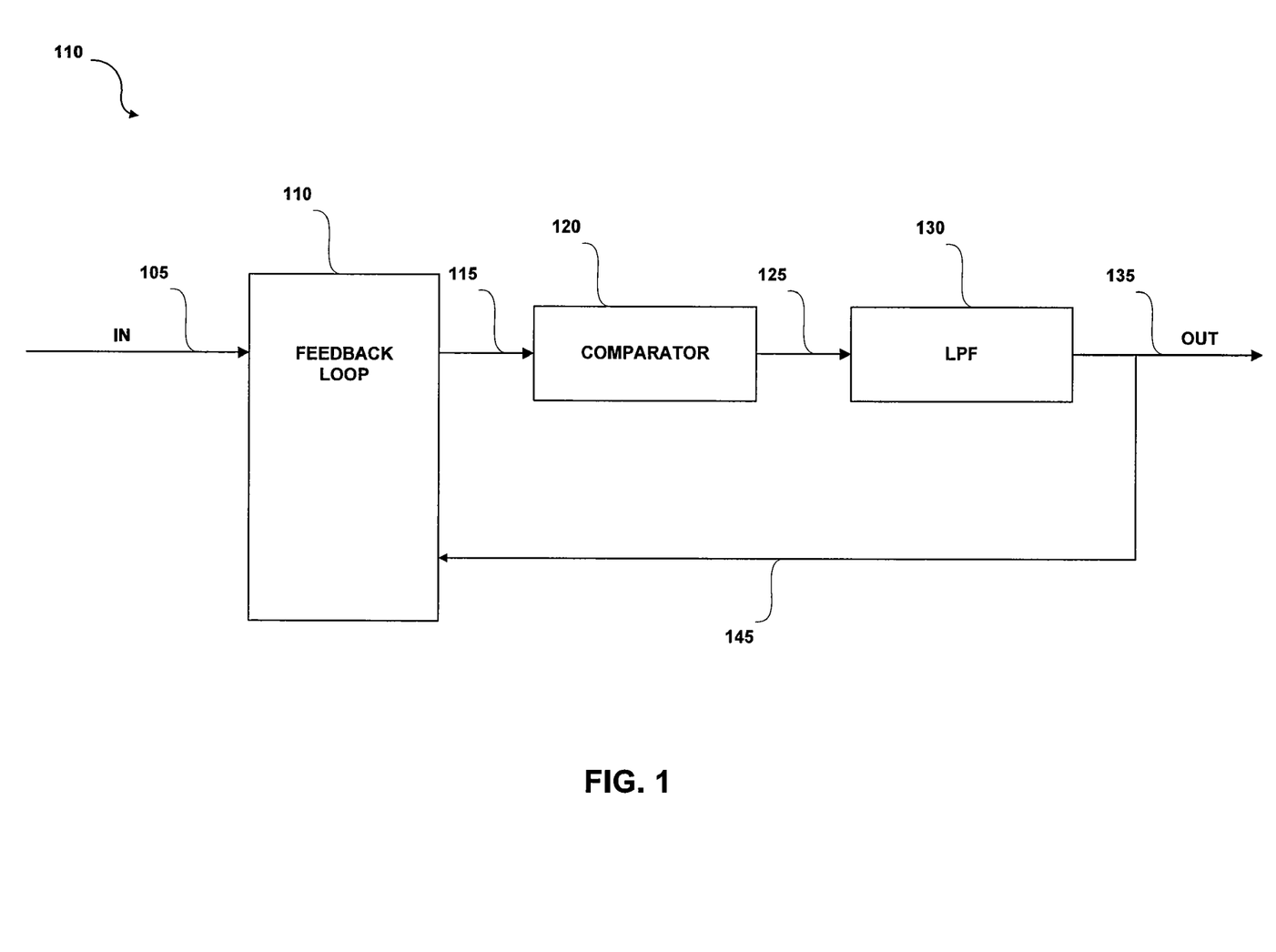
FIG. 1 shows an upper level representative block diagram of a class-D amplifier, in accordance with the present invention.

FIG. 1 shows an upper level representative block diagram of a class-D amplifier, in accordance with the present invention. An amplifier input signal on line 105 enters a feedback loop 110. The feedback loop 110 allows a feedback signal on line 145 to track the amplifier input signal on line 105. The feedback signal on line 145 is taken directly from an amplifier output signal on line 135. As a result, the amplifier output signal on line 135 tracks the amplifier input signal on line 105.

Feedback loop 110 generates a comparator input signal on line 115. The comparator input signal on line 115 enters a comparator 120. Comparator 120 amplifies the comparator input signal on line 115, and generates an amplified comparator output signal on line 125. The means by which comparator 120 amplifies the comparator input signal on line 115 determines the amplifier type. For the present invention, comparator 120 is configured to function as a class-D amplifier.

The comparator output signal on line 125 enters a low pass filter 130. Low pass filter 130 filters out the high frequency portion of the frequency spectrum in the comparator output signal on line 125. High frequencies are generated by class-D amplifiers, which rely on high frequency switching. Low pass filter 130 should be recognized as a functional block. That is, low pass filtering may be performed by a classical analog low pass filter, but also may be a direct by-product of a variety of other electrical and mechanical systems that may function as low pass filters in lieu of an explicit low pass filter function.

Figure 2:
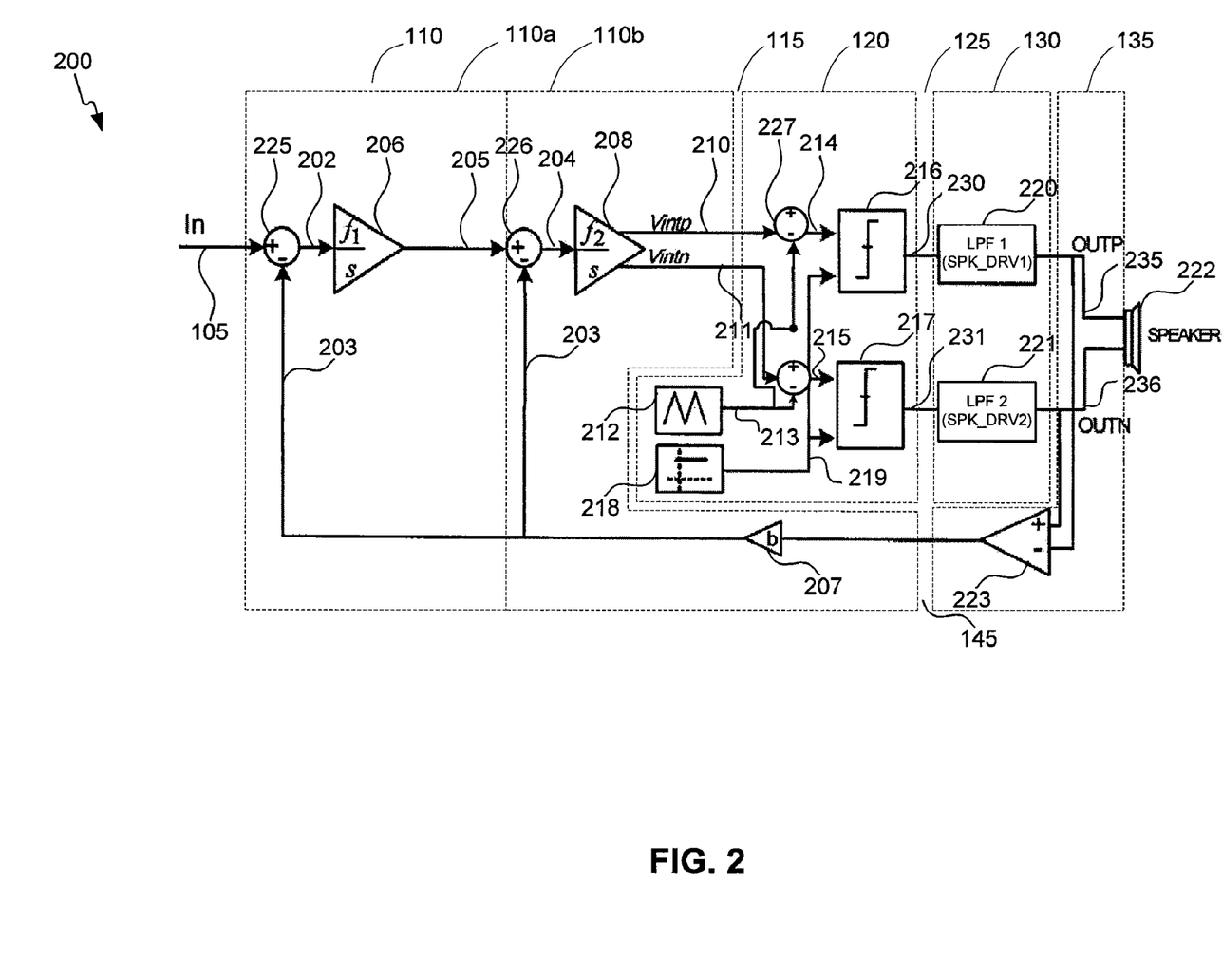
FIG. 2 shows a representative detailed block diagram of a filterless class-D amplifier, in accordance with the present invention.

FIG. 2 shows a representative detailed block diagram of a filterless class-D amplifier 200, in accordance with the present invention. The filterless class-D amplifier 200 comprises each of the functional blocks in the upper level block diagram 100, given in FIG. 1. Feedback loop 110 comprises an outer feedback loop 110a and an inner feedback loop 110b. Outer feedback loop 110a forces the feedback signal on line 145 to track the amplifier input signal on line 105. The feedback output signal on line 145 is taken directly from an amplifier output signal on line 135. As a result, the outer feedback loop forces the amplifier output signal on line 135 to track the amplifier input signal on line 105. Inner feedback loop 110b damps the response of outer feedback loop 110a, drastically reducing oscillations in one or more signals in the outer feedback loop 110a and the inner feedback loop 110b.

Outer feedback loop 110a takes a difference between the amplifier input signal on line 105 and a scaled feedback signal on line 203. The scaled feedback signal on line 203 is a product of the feedback signal on line 145 and a feedback gain b in a feedback gain block 207. The difference between the input signal on line 105 and the scaled feedback signal on line 203 is taken by a first summer 225. The output of first summer 202 is a first error signal 202. The outer feedback loop 110a drives the first error signal 202 toward zero, forcing the feedback signal 145, and amplifier output signal 135, to track the amplifier input signal 105.

A first integrator 206, with a unity bandwidth gain $f_1$, integrates the first error signal on line 202 to generate a first integrator output signal on line 205. A second summer 226 takes a difference between the first integrator output signal on line 205 and the scaled feedback signal on line 203. The output of the second summer 226 is a second error signal 204. The inner feedback loop 110b drives the second error signal 204 toward zero, drastically reducing oscillations in one or more signals in the outer feedback loop 110a and the inner feedback loop 110b.

A second integrator 208, with a unity bandwidth gain $f_2$, integrates the second error signal on line 204 to generate more than one comparator input signals on line 115. The comparator input signals on line 115 comprise a second integrator output signal on line 210, $V_{intp}$, and a negated second integrator output signal on line 211, $V_{intn}$. The second integrator output signal 210 and the negated second integrator output signal 211 exit the feedback loop 110 and enter the comparator 120.

Comparator 120 comprises a comparative signal generator 212, which generates comparative signal on line 213. The comparative signal on line 213 is added to the second integrator output signal on line 210 using a third summer 227, generating a third sum signal on line 214, that is an input to a first comparator 216. The comparative signal on line 213 is added to the negated second integrator output signal on line 211 using a fourth summer 228, generating a fourth sum signal on line 215, that is an input to a second comparator 217.

Comparator 120 further comprises a peak voltage generator 218, which generates a peak voltage on line 219, which is input to the first comparator 216 and the second comparator 217.

In the first comparator 216, if the third sum signal on line 214 is greater than the peak voltage on line 219, a maximum voltage level is output on the first comparator output line 230 and driven by a first speaker driver 220 (first low pass filter 220) to generate a positive amplifier output signal, OUTP, on line 235, which feeds a speaker 222. If the third sum signal on line 214 is less than the peak voltage on line 219, a minimum voltage level is output on the first comparator output line 230 and driven by the first speaker driver 220 (first low pass filter 220) to generate the positive amplifier output signal on line 235, which feeds the speaker 222.

Similarly, if the fourth sum signal on line 215 is greater than the peak voltage on line 219, a maximum negative voltage level is output on the second comparator output line 231 and driven by a second speaker driver 221 (second low pass filter 221) to generate a negative amplifier output signal, OUTN, on line 236, which feeds the speaker 222. If the fourth sum signal on line 215 is less than the peak voltage on line 219, a minimum negative voltage level is output on the second comparator output line 231 and driven by the second speaker driver 221 (second low pass filter 221) to generate the negative amplifier output signal on line 236, which feeds speaker 222.

The first and second comparator output signals on lines 230 and 231, respectively, correspond to the comparator output signal on line 125 in FIG. 1. The positive amplifier output signal on line 235 and the negative amplifier output signal on line 236 correspond to the amplifier output signal on line 135 in FIG. 1. The positive amplifier output signal on line 235 and the negative amplifier output signal on line 236 are summed at a fifth summer 223 to output a the feedback signal on line 145, initiating the feedback loop 110.

It should be noted that the representative detailed block diagram of a filterless class-D amplifier 200, which in accordance with the present invention, does not explicitly describe the low pass filter functional block 130 from FIG. 1. Low pass filtering is implicit to the function of first and second speaker drivers 220 and 221, respectively. In a representative embodiment of speaker drivers 220 and 221, speaker drivers 220 and 221 inductively couple first and second comparator output signals on lines 230 and 231, respectively, to speaker 222. Inductive coupling electrically isolates the first and second comparator output signals on lines 230 and 231, respectively, from speaker 222, and as a by product, act as low pass filters.

Furthermore, inductive coupling can be used to increase, or decrease, the gain of the filterless class-D amplifier 200 in the representative embodiment. In an embodiment, first and second low pass filters 220 and 221, respectively, can be implemented as step up amplifiers.

Figure 3:
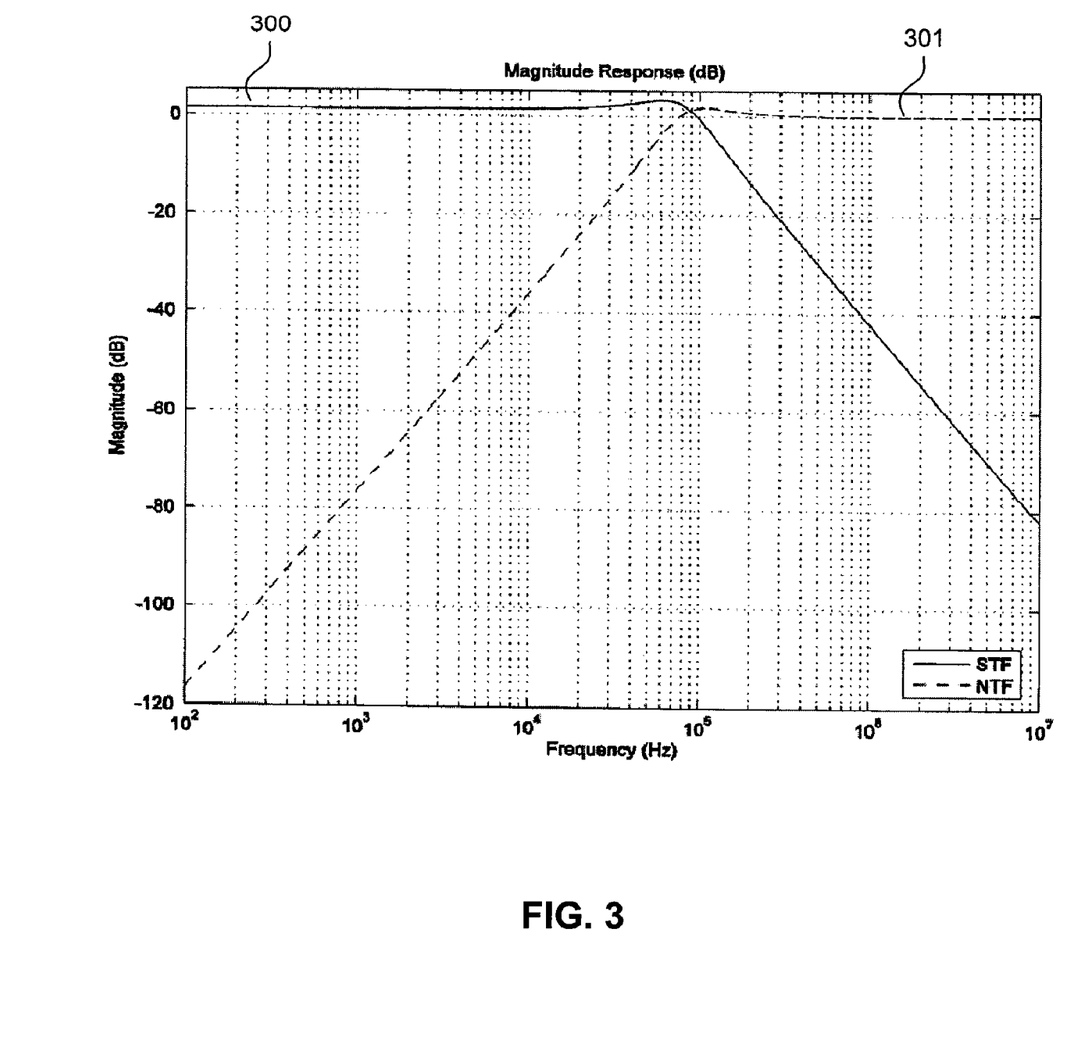
FIG. 3 shows the frequency response of the signal transfer function (STF) and noise transfer function (NTF) of the embodiment shown in FIG. 1.

FIG. 3 shows the frequency response of a signal transfer function 300 and the frequency response of a noise transfer function 301 of the embodiment of the class D amplifier shown in FIG. 2, where the following values have been set:

$f_1 = 555.5$ kHz $f_2 = 555.5$ kHz $b = 0.8553$ $f_{osc} = 620$ kHz  (EQN. 1)

$f_1$ and $f_2$ are unity gain bandwidths for first and second integrators 206 and 208, respectively, and b is the feedback gain 207. $f_{osc}$ is the oscillating frequency of the comparative signal 212. It should be noted that the present invention is not limited to the representative values given in EQN. 1.

The frequency response of the signal transform function 300 (y/x) and the frequency response of the noise transfer function 301 (y/n) are given by the following s-domain transforms:

$$y/x = 1/(s^2/F_1F_2 + Bs/F_1 + B) \quad \text{(EQN. 2)}$$

$$n/x = (s^2/F_1F_2)/(s^2/F_1F_2 + Bs/F_1 + B) \quad \text{(EQN. 3)}$$

As shown in FIG. 3, element 300, the DC gain for the representative embodiment in FIG. 2, with representative parameters defined as in EQN. 1, is 1.358 dB, which results in an output of 1.4 V. for a 1.2 V. input, yielding 30 mW of power for a 32 ohm speaker. The 3 dB cut-off frequency for the representative embodiment and parameter set is 107.3 kHz. To maintain stability, $\pi$ times the 3 dB cut-off frequency must be less than the oscillating frequency of the comparative signal on line 213.

At frequencies greater than the 3 dB cut-off frequency, where the frequency of the amplifier input signal on line 105 is greater than the oscillating frequency of the comparative signal on line 213 divided by $\pi$, the feedback loop in FIG. 2 becomes unstable. The instability is caused by under sampling third and fourth sum signals on lines 214 and 215, respectively, in first and second comparators 216 and 217. Under sampling aliases frequencies introduced to comparators 216 and 217, shifting the frequency of the first and second comparator output signals on lines 230 and 231, respectively, to lower values.

PWM is effectively a sigma-delta modulator with multirate sampling, where a variable dynamic range is set by the sampling rate interval. To satisfy the Nyquist sampling theorem, the minimum sampling rate must be at least twice the highest angular rate of the sampled signal. The minimum sampling rate of a unit triangle wave is $4f_A$, where $f_{66}$ is the frequency of the unit triangle wave. The highest angular rate of the sampled signal is $2\pi f$, where f is the frequency of the highest frequency sinusoid. The Nyquist criteria requires that $4f_{66} > 2(2\pi f)$, which reduces to the stability requirement given in the previous paragraph, $f_A/f > \pi$.

Figure 4:
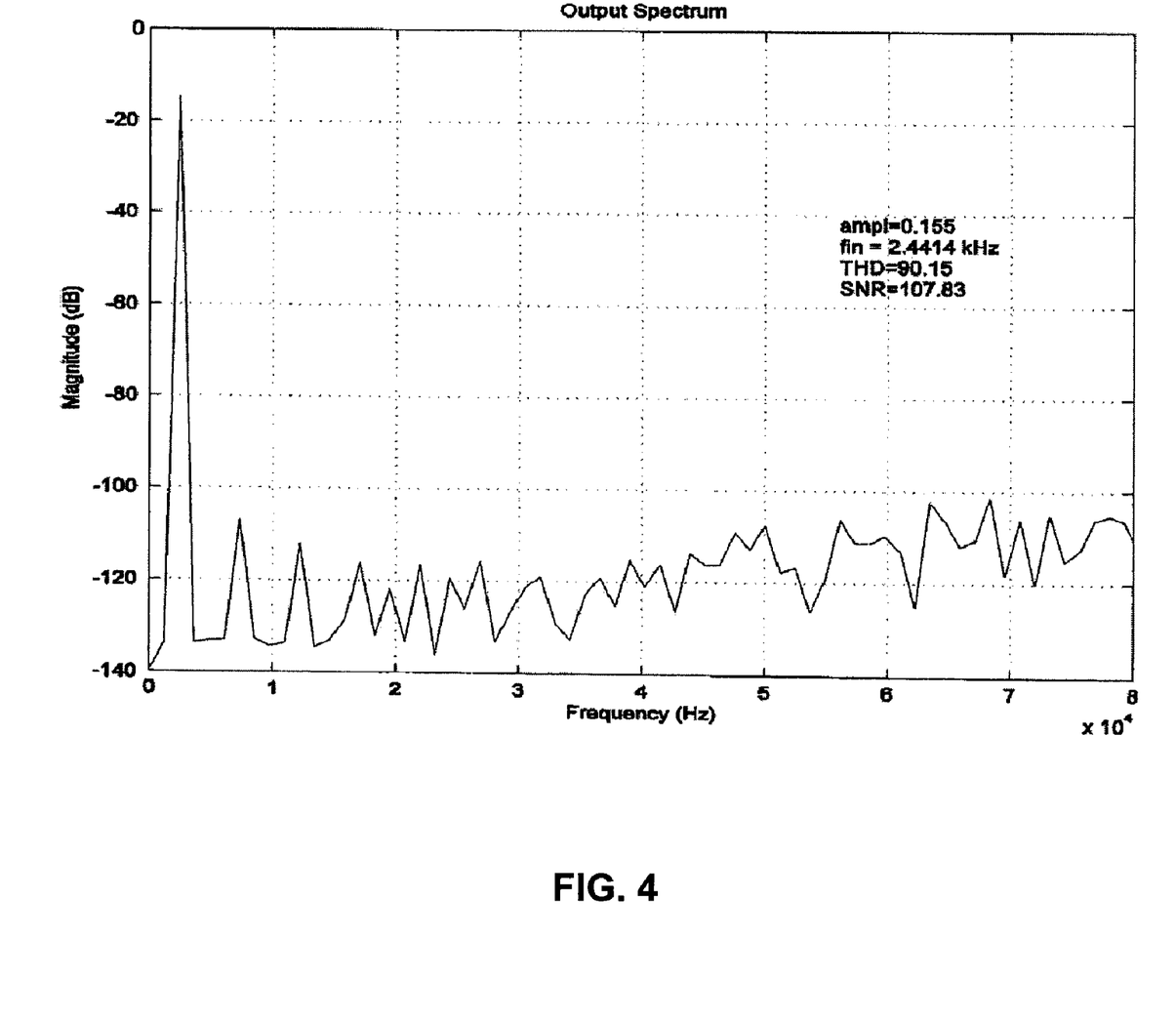
FIG. 4 shows the class-D amplifier output signal of the embodiment shown in FIG. 1, wherein $f_{osc}$=620 kHz.

FIG. 4 shows the class-D amplifier output signal of the embodiment shown in FIG. 2, wherein $f_{osc} = 620$ kHz, with amplifier output signal 135 amplitude, amplifier input signal 105 frequency, total harmonic distortion (THD), and signal to noise ratio (SNR) given. The signal to noise floor is very low, approximately $-120$ dB. As expected, the amplitude output signal 135 noise is composed of the odd harmonics of the oscillating frequency for the comparative signal 213, typical of square wave frequency spectra.

Figure 5:
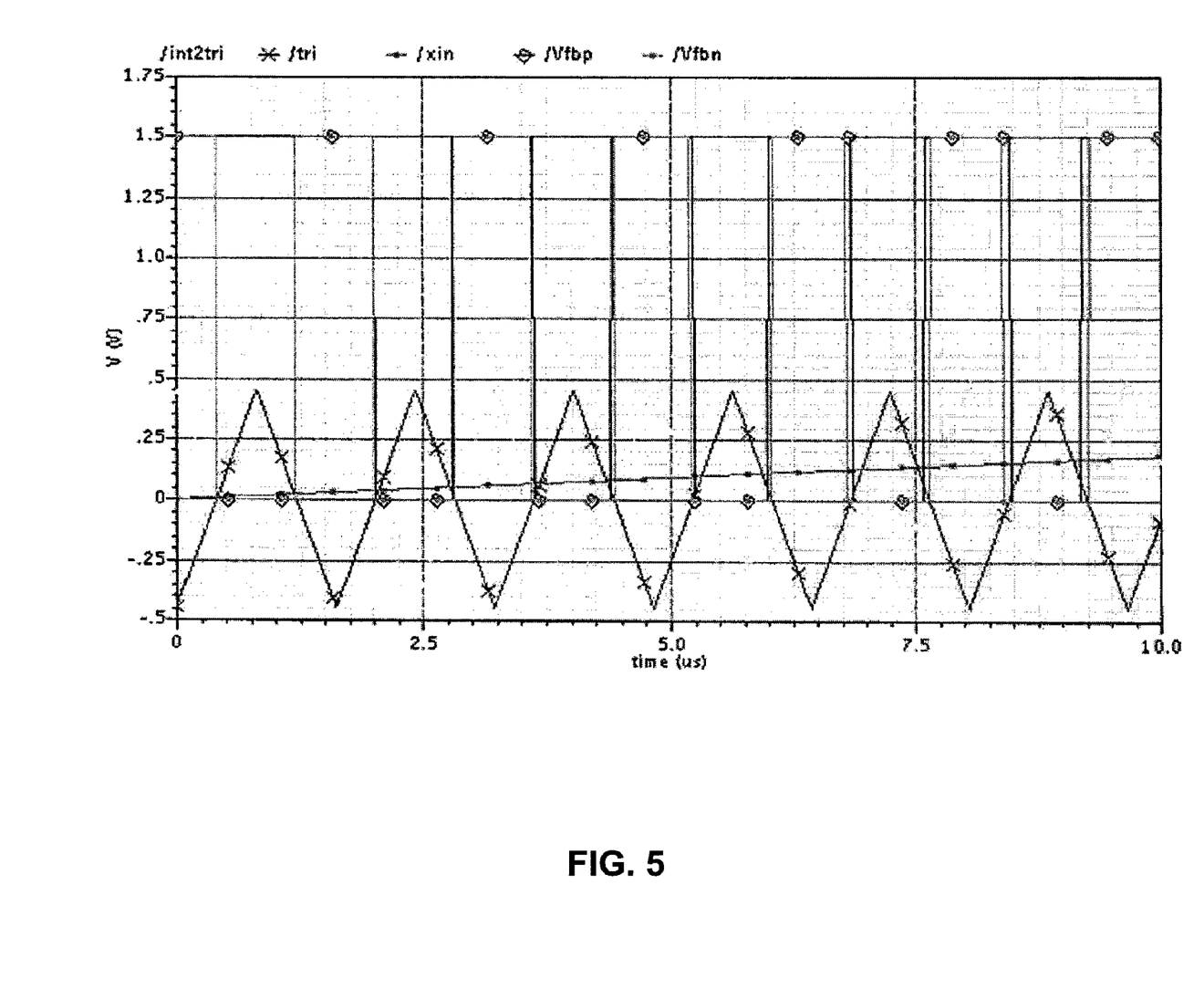
FIG. 5 shows representative waveforms of a conventional two-pulse filterless class-D amplifier.

FIG. 5 shows representative waveforms of a conventional two-pulse filterless class-D amplifier. As discussed previously, the conventional filterless class-D driver generates up to two pulses per half period of the comparative signal. The pulses are triggered by both clock transitions and comparator logic. Clock transitions refer to the beginning the comparative signal cycle, for both the comparative signal and the negated comparative signal. Comparator logic refers to the process where comparators set the voltage levels for speaker drivers, as discussed previously.

Figure 6:
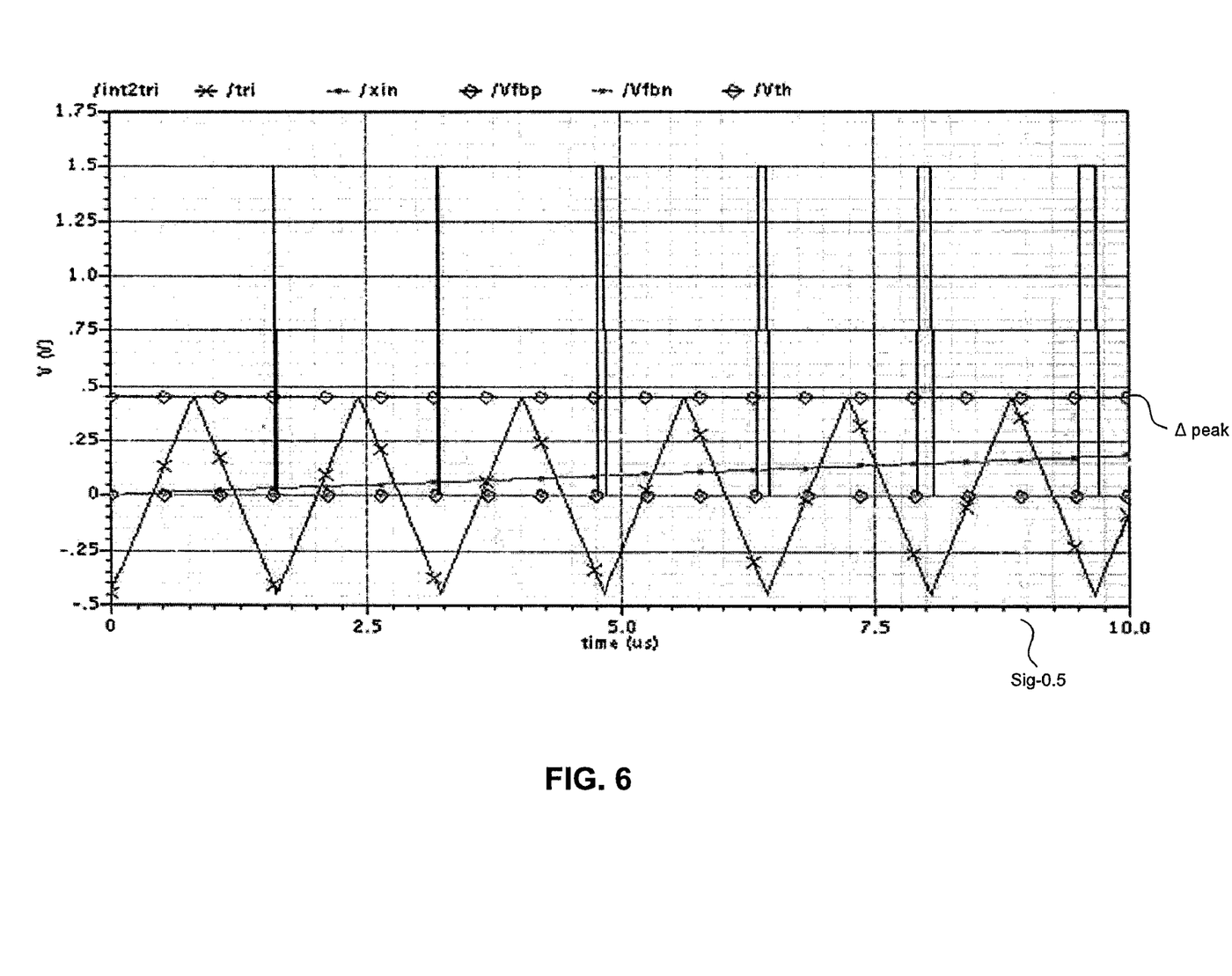
FIG. 6 shows representative waveforms of a filterless class-D amplifier, in accordance with the present invention.

FIG. 6 shows representative waveforms of a filterless class-D amplifier, in accordance with the present invention. As discussed previously, the invented filterless class-D amplifier is limited to one pulse per half period of the comparative signal, where a half cycle is defined to span consecutive zero crossings of the comparative signal. In contrast to the conventional filterless class-D amplifier, the pulses for the invented filterless class-D amplifier are triggered by comparator logic alone. Comparator logic refers to the process whereby comparators set the voltage levels for speaker drivers, as discussed previously with regard to the present invention.

Generating at most one pulse per half period of the comparative signal reduces the dynamic switching noise. Dynamic switching noise is relatively predictable in the present invention. The dynamic switching noise frequency spectrum is centered at the odd harmonics of the frequency of the comparative signal, with side lobes inversely proportional to pulse widths.

Generating up to two pulses per half period of the comparative signal, as shown in FIG. 5 for the conventional filterless class-D amplifier, effectively samples twice as fast with pulse widths half as wide as the invented filterless class-D amplifier. The dynamic switching noise frequency spectrum shifts in frequency to twice the values given for the invented filterless class-D amplifier, but dynamic switching noise side lobes are now twice as wide.

Additionally, the timing between the comparative signal and the negated comparative signal is critical in the conventional filterless class-D amplifier, as the switching occurs at the comparative signal and negated comparative signal crossover points. In stark contrast, the timing between the comparative signal and the negated comparative signal is not critical in the invented filterless class-D amplifier, as the switching occurs away from the comparative signal and negated comparative signal cross-over points.

As a result, the conventional filterless class-D amplifier is much more susceptible to jitter noise on the comparative signal and the negated comparative signal than the invented filterless class-D amplifier.

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

All publications, patents and patent applications mentioned in this specification are herein incorporated by reference to the same extent as if each individual publication, patent or patent application was specifically and individually indicated to be incorporated by reference.

What is claimed is:

1. A class D amplifier method to amplify signals, comprising:
    (1) generating a comparator input signal in accordance with a first integrator output signal and a scaled version of a feedback signal, wherein the first integrator output signal is generated in accordance with the amplifier input signal and the feedback signal;
    (2) generating a comparator output signal in accordance with the comparator input signal, a peak voltage, and a comparative signal; and
    (3) generating an amplifier output signal and the feedback signal in accordance with the comparator output signal.

2. The class D amplifier method of claim 1, wherein the comparator input signal of step (1) comprises a second integrator output signal and a negated second integrator output signal.

3. The class D amplifier method of claim 1, wherein the comparator output signal of step (2) comprises a first comparator output signal and a second comparator output signal,
    wherein the comparator input signal comprises a second integrator output signal and a negated second integrator output signal,
    wherein the first comparator output signal is generated in accordance with the second integrator output signal, the peak voltage, and the comparative signal, and wherein the second comparator output signal is generated in accordance with the negated second integrator output signal, the peak voltage, and the comparative signal.

4. The class D amplifier method of claim 3, wherein the comparative signal is generated to have a peak value substantially equal to a peak value of the second integrator output signal or to a peak value of the negated second integrator output signal.

5. The class D amplifier method of claim 4, wherein the peak voltage is generated to have a peak value substantially equal to the peak value of the comparative signal.

6. The class D amplifier method of claim 1, wherein the comparator output signal comprises a first comparator output signal and a second comparator output signal, and
wherein the amplifier output signal and the feedback signal are generated in accordance with the first comparator output signal and the second comparator output signal.

7. The class D amplifier method of claim 6, wherein the first comparator output signal and the second comparator output signal both cannot have a maximum absolute value in the same half cycle between zero crossings.

8. The class D amplifier method of claim 7, wherein the generation of the amplifier output signal and the feedback signal is performed using a low pass filter function.

9. The class D amplifier method of claim 8, where the low pass filter function is performed using a step up transformer function.

10. The class D amplifier method of claim 1, wherein the amplifier output signal comprises a positive amplifier output signal and a negative amplifier output signal.

11. The class D amplifier method of claim 10, wherein the feedback signal is a combination of the positive amplifier output signal and the negative amplifier output signal.

12. A class D electronic amplifier comprising:
    (a) a feedback loop stage, comprising an outer feedback loop stage that provides a first integrator output signal in accordance with an amplifier input signal and a scaled version of a feedback signal, and an inner feedback loop stage that provides a comparator input signal including a second integrator output signal and a negated second integrator output signal in accordance with the first integrator output signal and the scaled feedback signal, wherein the scaled feedback signal is provided by a feedback gain block having the feedback signal as an input;
    (b) a comparator stage which provides a comparator output signal in accordance with the comparator input signal and a comparator logic, the comparator logic adds the comparator input signal to a comparative signal to produce a sum signal, the sum signal is compared to a peak voltage; and
    (c) a low pass filter stage which provides an amplifier output signal, which is used as the feedback signal, in accordance with the comparator output signal.

13. The class D electronic amplifier of claim 12,
wherein the comparator stage comprises:
    (1) an input for the comparator input signal, the comparator input signal comprising a second integrator output signal and a negated second integrator output signal;
    (2) a third summer which provides a third sum signal in accordance with the second integrator output signal and a comparative signal;
    (3) a fourth summer which provides a fourth sum signal in accordance with the second negated integrator output signal and the comparative signal;
    (4) a first comparator which provides a first comparator output signal in accordance with the third sum signal and the peak voltage; and
    (5) a second comparator which provides a second comparator output signal in accordance with the fourth sum signal and the peak voltage,
    wherein the sum signal comprises the third sum signal and the fourth sum signal, and
    wherein the comparator output signal comprises the first comparator output signal and the second comparator output signal.

14. The class D electronic amplifier of claim 13, wherein the peak voltage is provided by a peak voltage generator.

15. The class D electronic amplifier of claim 14, wherein the comparative signal is provided by a comparative signal generator.

16. The class D electronic amplifier of claim 15, wherein the comparative signal generator provides the comparative signal having a peak value substantially equal to a peak value of the second integrator output signal or to a peak value of the negated second integrator output signal.

17. The class D electronic amplifier of claim 16, wherein the peak voltage generator provides the peak voltage having a peak value substantially equal to the peak value of the comparative signal.

18. The class D electronic amplifier of claim 12, wherein the low pass filter stage comprises:
    (1) an input for the comparator output signal, the comparator output signal comprising a first comparator output signal and a second comparator output signal;
    (2) a first low pass filter which receives the first comparator output signal and provides a positive amplifier output signal; and
    (3) a second low pass filter which receives the second comparator output signal and provides a negative amplifier output signal,
    wherein the amplifier output signal comprises the positive amplifier output signal and the negative amplifier output signal.

19. The class D electronic amplifier of claim 18, wherein the feedback signal is provided as the output of a fifth summer having as inputs the positive amplifier output signal and the negative amplifier output signal.

20. The class D electronic amplifier of claim 18, wherein the first low pass filter is a first step up transformer, and wherein the second low pass filter is a second step up transformer.

21. The class D electronic amplifier of claim 12, wherein the comparative signal is a triangle wave.

22. A class D amplifier method to amplify signals, comprising:
    (1) generating a comparator input signal in accordance with an amplifier input signal and a feedback signal;
    (2) generating a comparator output signal in accordance with the comparator input signal, a peak voltage, and a comparative signal; and
    (3) generating an amplifier output signal and the feedback signal in accordance with the comparator output signal,
        wherein the comparator output signal comprises a first comparator output signal and a second comparator output signal,
        wherein the first comparator output signal and the second comparator output signal both cannot have a maximum absolute value in the same half cycle between zero crossings, and wherein the amplifier output signal and the feedback signal are generated in accordance with the first comparator output signal and the second comparator output signal.

23. A class D electronic amplifier comprising:

a feedback gain block that outputs a scaled feedback signal in response to an input feedback signal;

an outer feedback loop stage that provides a first integrator output signal in response to a difference between an amplifier input signal and the scaled feedback signal;

an inner feedback loop stage that provides a second integrator output signal and a negated second integrator output signal in response to a difference between the first integrator output signal and the scaled feedback signal;

a first comparator stage that provides a first comparator output signal in response to the second integrator output signal, wherein a maximum voltage level is provided on the first comparator output signal when the sum of the second integrator output signal and a comparative signal exceeds a peak voltage, and a minimum voltage level is provided on the first comparator output signal when the peak voltage exceeds the sum of the second integrator output signal and the comparative signal;

a second comparator stage that provides a second comparator output signal in response to the negated second integrator output signal, wherein a maximum negative voltage level is provided on the second comparator output signal when the sum of the negated second integrator output signal and the comparative signal exceeds a peak voltage, and a minimum negative voltage level is provided on the second comparator output signal when the peak voltage exceeds the sum of the negated second integrator output signal and the comparative signal; and a low pass filter stage that provides an amplifier output signal, which is used as the feedback signal, in response to the first comparator output signal and the second comparator output signal.

* * * * *

UNITED STATES PATENT AND TRADEMARK OFFICE
CERTIFICATE OF CORRECTION

PATENT NO.       : 7,609,110 B2                                   Page 1 of 1
APPLICATION NO.  : 11/797037
DATED            : October 27, 2009
INVENTOR(S)      : Minsheng Wang It is certified that error appears in the above-identified patent and that said Letters Patent is hereby corrected as shown below:

In column 3, line 22 in Specification, delete "ioop" and insert --loop--, therefor.
In column 5, line 29 in Specification, delete "$f_{66}$" and insert --$f_\Delta$--, therefor.
In column 5, line 32 in Specification, delete "$4f_{66}$" and insert --$4f_\Delta$--, therefor.

Signed and Sealed this

Sixteenth Day of February, 2010

David J. Kappos
*Director of the United States Patent and Trademark Office*